United States Patent [19]

Patel

[11] 4,000,954
[45] Jan. 4, 1977

[54] AUTOMATIC TOOL CHANGING APPARATUS FOR DRILLING MACHINES AND THE LIKE

[75] Inventor: Jayantilal S. Patel, El Monte, Calif.

[73] Assignee: Digital Systems, Inc., Arcadia, Calif.

[22] Filed: Oct. 31, 1975

[21] Appl. No.: 627,617

[52] U.S. Cl. .................................. 408/3; 408/31; 279/50

[51] Int. Cl.$^2$ ...................................... B23B 47/00

[58] Field of Search ............. 408/3, 4, 31; 29/26 A, 29/568; 279/50, 4

[56] References Cited

UNITED STATES PATENTS

| | | | |
|---|---|---|---|
| 3,064,502 | 11/1962 | Pittwood | 29/26 A X |
| 3,171,327 | 3/1965 | Williamson | 29/26 A X |
| 3,709,623 | 1/1973 | Stephan et al. | 29/26 A X |

*Primary Examiner*—Gil Weidenfeld
*Attorney, Agent, or Firm*—Gardner and Anten

[57] ABSTRACT

An automatic tool changing apparatus incorporated in a drilling machine or the like comprises a plurality of collets, each for supporting and selectively grasping a tool holder mechanism. Each of the collets is slotted in its upper and central portions to divide the collet into a plurality of arcuate sections. The central portion of each collet is of generally truncated cone-shaped configuration, and rests in a generally truncated cone-shaped bore in a collet support block. A pneumatic piston arrangement is connected to the collets for selectively pulling the collets downwardly in their respective collet support blocks to move the generally arcuate sections of each collet radially inwardly to grasp a tool holder mechanism. Spring return means are provided for moving the collets into their normal positions wherein they will support, but will not grasp the tool holder mechanisms.

18 Claims, 7 Drawing Figures

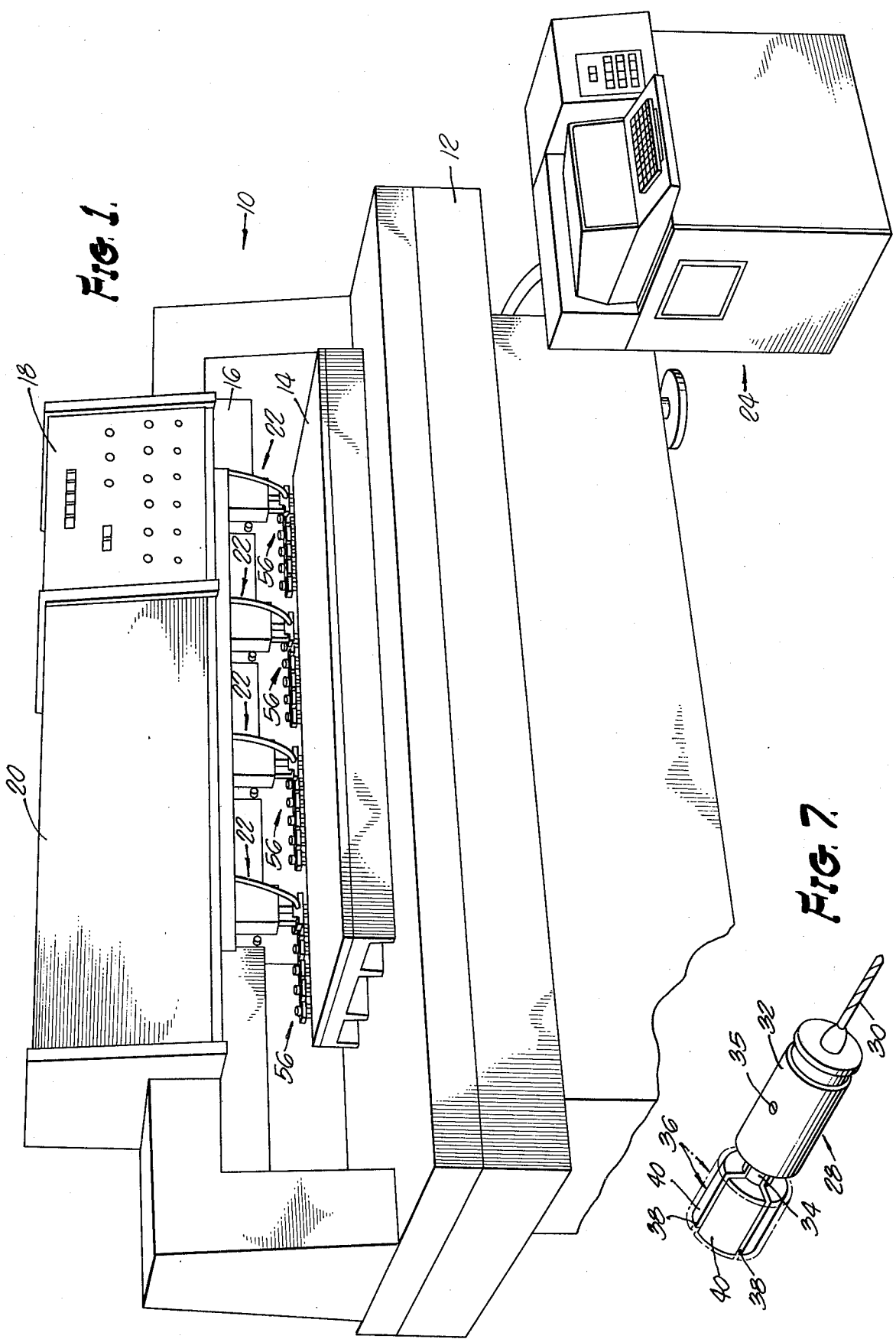

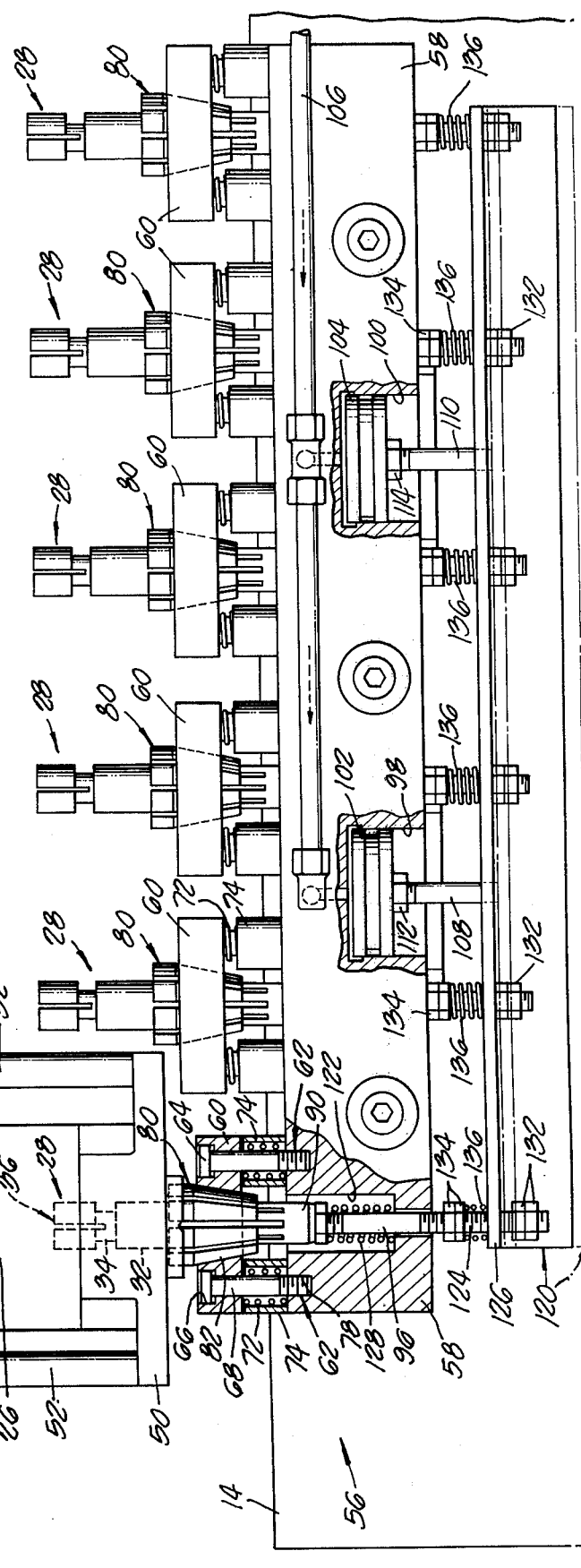
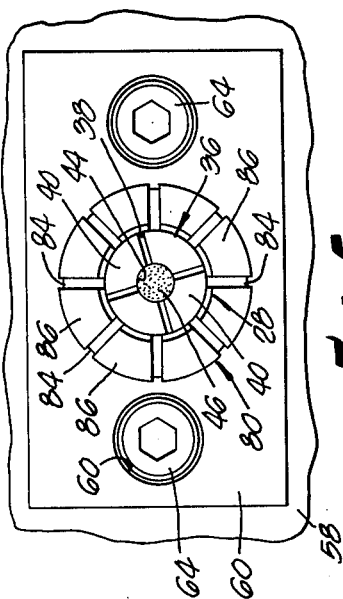
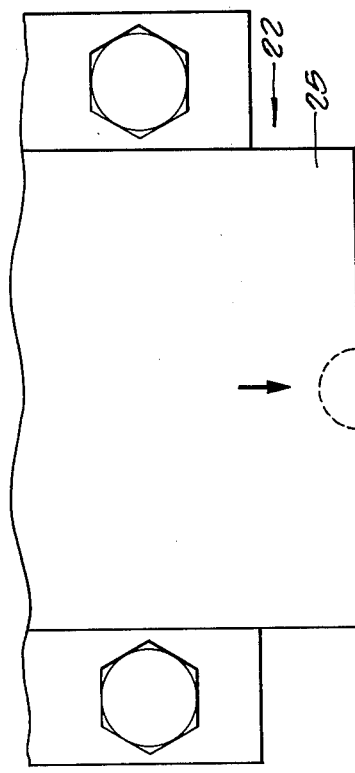

4,000,954

AUTOMATIC TOOL CHANGING APPARATUS FOR DRILLING MACHINES AND THE LIKE

FIELD OF THE INVENTION

The present invention relates to automatic tool changing apparatuses and, more specifically, to an automatic tool changing apparatus for drilling machines and the like.

BACKGROUND OF THE INVENTION

In various types of machines (such as automatic drilling machines, for example), it is necessary to selectively change the tools in the tool holding mechanism of the machines. This is true, for example, in numerically controlled drilling machines for drilling, for example, different sized holes through a stack or several stacks of printed circuit boards.

During the drilling operation, it is necessary that the drills in the drilling mechanisms be periodically replaced with different sized drills for subsequent drilling operations. Changing of the drills, however, results in inoperative or "down" time of the drilling machine. Accordingly, it is desirable that the drill changing procedure be accomplished as expeditiously as possible.

Of course, numerous attempts have been made to design mechanism which reduce the amount of time required for the drill changing operation.

For example, U.S. Pat. No. 3,795,455 to Kosmowski, is directed to an improved tool holder mechanism (referred to in the Patent as a collet) which facilitates rapid manual replacement of one drill for another. However, the mechanism disclosed in the Kosmowski U.S. Pat. No. 3,795,455 is not entirely satisfactory since it requires manual operation in order to change the tools (i.e., the drills) in the apparatus.

Numerous attempts have also been made to design automatic tool changers. For example, see U.S. Pat. Nos. 3,458,924; 3,546,774; 3,566,516; 3,646,664; 3,672,691; 3,709,623; 3,780,423; and 3,803,680. In addition, Excellon Automation Division of Excellon Industries has provided a drill changing mechanism on its Mark III D/E System.

The foregoing-identified drill changing apparatuses may generally be characterized as being highly complex and/or relatively inefficient in operation. Thus, none of the prior art drill changing apparatuses has fulfilled the need for a relatively simple, relatively inexpensive, efficient and effective drilling changing mechanism.

SUMMARY OF THE INVENTION

In view of the foregoing, it is an object of the present invention to provide a relatively simple, inexpensive and efficient automatic tool changing apparatus for drilling machines and the like.

The foregoing and other objects of the present invention have been realized by providing an improved tool changing apparatus which comprises a member or members (e.g., one or more drill spindle mechanisms) for releasably retaining a tool mechanism or mechanisms (e.g., a drill bit holding mechanism or mechanisms), supporting means (e.g., a plurality of slotted collets having arcuate segments adapted for supporting a plurality of tool mechanisms (e.g., drill bit holding mechanisms) and means operative in response to delivery of a tool mechanism to one or more of the supporting means to move said supporting means to positions wherein they firmly grasp tool mechanisms delivered thereto (e.g., pneumatic system and associated means for causing said arcuate segments of said slotted collets to be moved radially inwardly to firmly grasp drill bit holder mechanisms deposited therein).

Other objects and advantages of the present invention will become apparent from a review of the following detailed description and the appended drawings of a preferred exemplary embodiment of the present invention.

BRIEF DESCRIPTION OF THE DRAWINGS

In the drawings:

FIG. 1 is a perspective view of a numerically controlled drilling machine in which the automatic tool changing mechanism of the present invention is incorporated.

FIG. 2 is a rear elevation view, partly in section, illustrating the autmtic tool changing apparatus of the present invention.

FIG. 5 is a top plan view of a collet support block which forms part of the tool changing apparatus of the present invention, the collet support block having a slotted collet member therein with the collet member loosely holding a tool (e.g., a drill bit) holding mechanism therein.

FIG. 7 is a perspective view of a drill bit holder mechanism which may be selectively picked-up or deposited by the tool changing apparatus of the present invention.

DETAILED DESCRIPTION OF A PREFERRED EMBODIMENT

Figure 3:
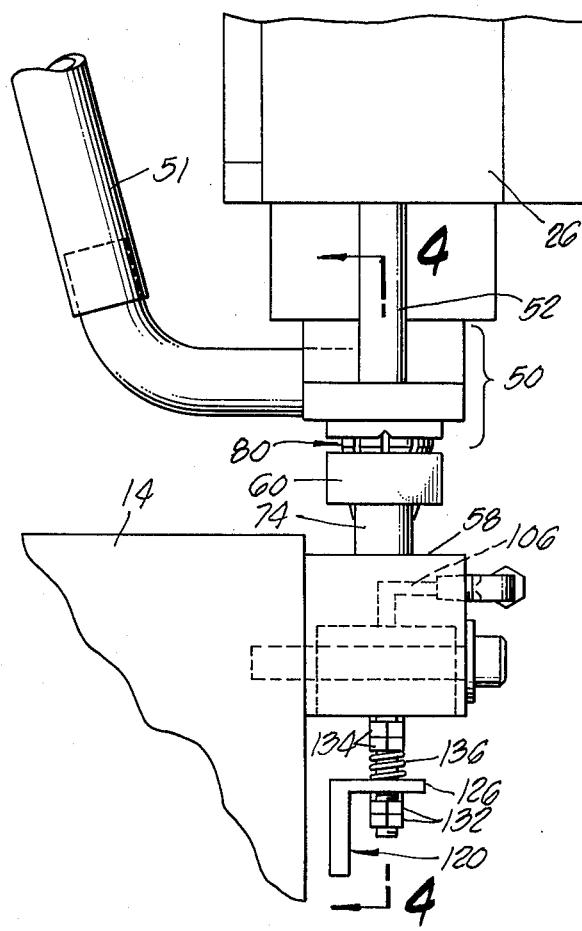
FIG. 3 is a side elevation view of the automatic tool changing apparatus of the present invention.

Referring now to the drawings, FIG. 1 shows a numerically controlled drilling machine 10 which incorporates a preferred embodiment of the automatic tool changing apparatus of the present invention.

The numerically controlled drilling machine includes a rather massive base 12 which supports a movable work table 14 and an overhead bridge 16.

A control panel 18, a cover member 20 and a plurality of drill spindle mechansim 22 are mounted on the overhead bridge 16.

The control panel 18 contains the control circuitry and mechanisms (not shown) for operating (i.e., rotating and vertically feeding) the drill spindle mechanism 22, and the cover member 20 contains and houses the mechanical elements and components for operating the drill spindle mechanisms.

The movable work table 14 is adapted to support work (not shown printed circuit boards through which holes are to be drilled, for example) thereon. The work table 14 is mounted for movement forward, backward, to the left and to the right, relative to the base 12, to position work pieces thereon under the appropriate drill spindle mechanisms 22.

Movement of the work table 14, operation of the drill spindle mechanism 22 and the operation of the tool changing apparatus of the present invention may be controlled by an operator at a computer console 24 (FIG. 1) or by some other suitable programming means (not shown).

As shown in FIG. 2, each drill spindle mechanism 22 includes a spindle mounting member 25 which retains a rotatable spindle 26 which is adapted to pick-up, deposit, rotate and feed (i.e., in a vertical direction) a drill bit holder mechanism.

The drill bit holder mechanism 28 is shown in detail in FIG. 7. The drill bit holder mechanism 28 is the subject matter of U.S. Pat. No. 3,795,455, wherein it is referred to as a "collet".

The drill bit holder mechanism 28 has a generally cylindrical tool holding end 32 which is adapted by means of a set screw, 35, to hold a suitable tool (e.g., drill bit). The drill bit holder mechanism further includes a reduced-diameter central section 34 and an outer end section 36. The outer end section 36 and a portion of the reduced-diameter section 34 are provided with a plurality of radially extending, circumferentially-spaced slots 38 therein which divides the outer end 36 into four generally arcuate portions 40. This slotted arrangement of the outer end section 36 of the drill bit holder mechanism 28 permits the outer end 36 to be compressed radially inwardly to the position shown in solid lines in FIG. 7, and to be expanded radially outwardly to the position shown in phantom lines in FIG. 7.

Figure 6:
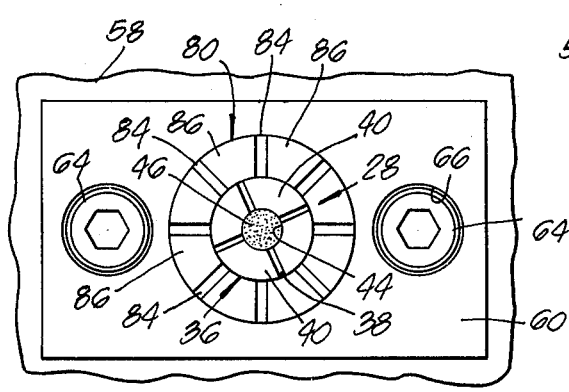
FIG. 6 is a top plan view similar to FIG. 5, showing the collet support block with the slotted collet member in its constricted position wherein its arcuate portions have been moved radially-inward to firmly grasp the tool holder.

As best shown in FIGS. 5 and 6, the slotted outer end section 36 of the drill bit holder mechanism 28 is provided with an internal bore 44 into which a cylindrical plug 46 of generally elastic material (e.g., rubber) is disclosed. This cylindrical plug member tends to bias the generally arcuate sections 40 of the slotted outer end 36 radially outward for holding and maintaining the arcuate sections 40 in place when the mechanism is in a static state.

As best shown in FIGS. 2 and 3, a work stabilizing pressure foot 50 is connected to the spindle mounting member 25 by means of a pair of slide rods 52, 52. This work stabilizing pressure foot 50 is adapted to be extended by means of the slide rods 52 during drilling operations to maintain the work (not shown; e.g., printed circuit boards into which holes are to be drilled) in a stable or secure position on the work table 14 so that the work will not move during the drilling operations.

The work stabilizing pressure foot 50 is adapted to be moved to its retracted position (i.e., the position shown in FIGS. 2, 3 and 4 of the drawings) during the tool changing operation (i.e., when a drill spindle mechanism 22 is picking up or depositing a drill bit holder mechanism 28).

A vacuum hose 51 (FIG. 3) is connected to the drilling mechanism for removing chips and other debris generated during the drilling operation.

The automatic tool changing apparatus of the present invention includes a plurality (e.g., four in the embodiment shown in FIG. 1) of tool holder magazines 56 secured to the back or rear sides of the movable work table 14 for retaining and operating tool holder supporting collet members 80. The structure and operation of each tool holder magazine 56 may best be appreciated by reviewing FIG. 2.

Each tool holder magazine 56 includes a generally rectilinear magazine support block 58 having a plurality (e.g., six in the embodiment shown in FIG. 2) of collet support blocks 60 mounted thereon. Each of the collet support blocks 60 is connected to the magazine support block 58 by means of a pair of socket head screws 62, 62. Each screw 62 includes an enlarged head portion 64 which is slidably disposed in an enlarged cavity or chamber 66 in the upper surface of its respective collet support block 60. Each screw 62 further includes a central section 68 which extends downwardly through a bore 70 in the collet support block and through the center of a compression spring 72 and an annular spacer 74 disposed between the magazine support block 58 and the collet support block 60. The lower end 76 of each of the screws 62 is threaded and screwed into an internally threaded hole 78 in the upper end of the magazine support block.

From the foregoing, it will be appreciated that each of the collet support blocks 60 is free to move downwardly toward the magazine support block 58 a limited distance, against the force of the compression springs 72, 72, until the lower surface of the collet support block 60 engages the upper end of the annular spacers 74, 74 disposed between each collet support block 60 and the magazine support block 58. Upward movement of each of the collet support block 60 relative to the magazine support block 58 is limited by means of the enlarged heads 64, 64 of the screws 62, 62 which engage and contact the lower surface of the cavities or chambers 66, 66 in the collet support block 60. Upward movement of the collet support block is accomplished by means of the action of the compression springs 72, 72.

As described more fully hereinafter, the structure of each of the collet support blocks 60, together with the compression springs 72, 72 function as an impact absorbing mechanism to cushion the impact on each of the collet support blocks 60 when the associated drill spindle 26 descends to pick up or deposit one of the tool holding members 28.

As best shown in FIGS. 2, 4, 5 and 6, a tool holder supporting collet member 80 is disposed in each of the collet support blocks 60. Each of the tool holder supporting collet members 80 includes an upper end 81 and a central section 82 which are provided with a plurality of radially extending slots 84 dividing the upper end 81 and the central portion 82 of the collet member into a plurality of generally arcuate sections 86.

This slotted structure of the upper end 81 and the central portion 82 of each collet member 80 allows the collet member 80 to be compressed radially inwardly from the position shown in FIG. 5 (wherein the collet member 80 does not firmly engage or retain a tool holder member 28 therein) to the radially inwardly compressed position shown in FIG. 6 (wherein the collet member 80 will firmly engage and retain the tool holer 28 therein).

Figure 4:
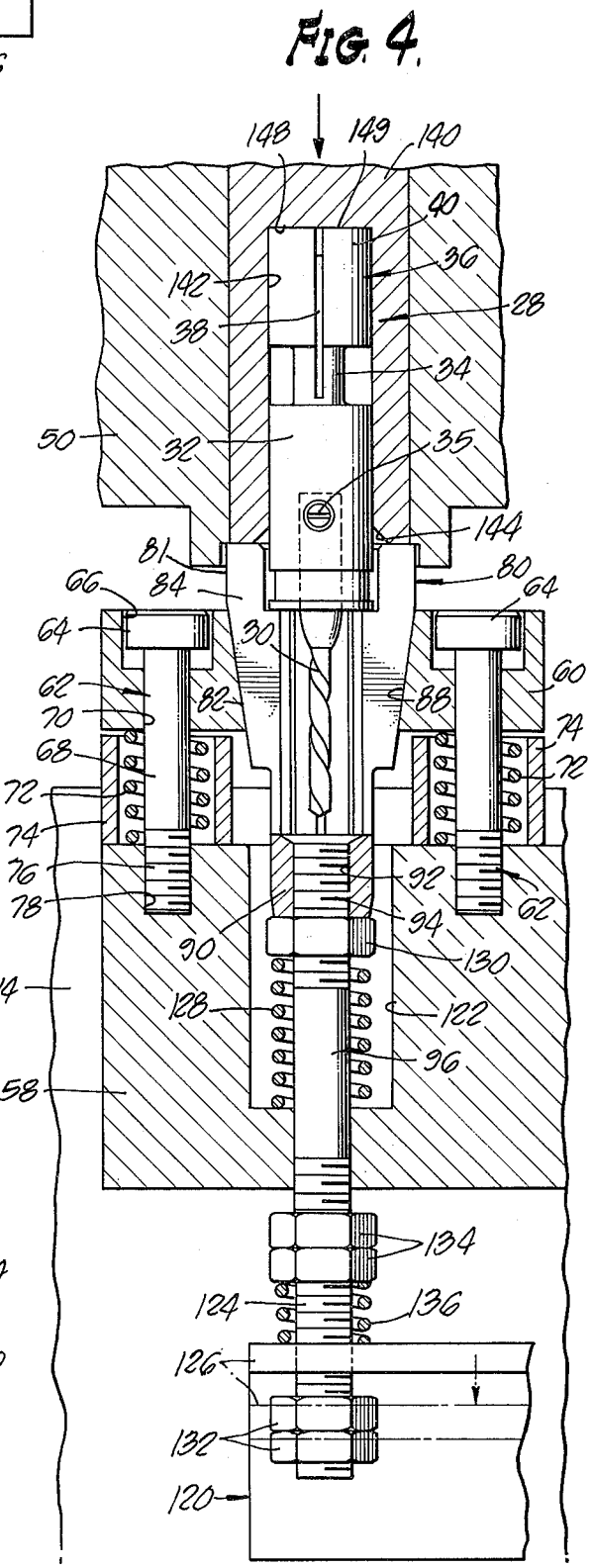
FIG. 4 is an enlarged sectional elevation view, taken along the plane 4—4 of FIG. 3 and looking in the direction of the arrows.

The central slotted portion 82 of the collet member 80 is of generally truncated cone-shaped configuration, as best shown in FIG. 4.

Each of the collet support blocks 60 has a generally truncated cone-shaped bore 88 extending through the central portion thereof for conforming to, accommodating, and supporting the central slotted, generally truncated cone-shaped portion 82 of the collet member.

The lower portion 90 of each of the collet members 80 is not slotted, and, as best shown in FIG. 4, the extreme lower portion of each of the collet members is provided with an interally threaded bore 92 which receives the upper, externally threaded portion 94 of an actuator shaft 96.

As best shown in FIG. 2, the magazine support block 58 includes a pair of piston chambers 98 and 100 therein. Each of the piston chambers 98 and 100 has a pneumatic piston 102, 104 slidably disposed therein for vertical movement. A pneumatic line 106 is connected to and communicates with the upper portions of the piston chambers 98 and 100 for feeding air under pressure from a suitable source (not shown) to the upper ends of the piston chambers.

The pneumatic pistons 98 and 100 are connected to downwardly extending piston rods 108, 110, each of which has its upper ends threaded and connected to its respective piston and held in place by means of a nut 112, 114.

The lower ends of the piston rods 108, 110 are connected to an actuator bar 120, which, as best shown in FIGS. 3, is in the shape of a right angle iron having a horizontal arm 126.

The magazine support block 58 is also provided with a plurality of upwardly-opening chambers 122, one of such chambers 122 being associated with each of the collet members 80.

As best shown in FIG. 4, each of the actuator shafts 96 has its upper threaded end 94 threadably secured to the lower end of its respective collet member 80. The actutor shaft 96 extends downwardly through the chamber 122 in the magazine block 58 and has its lower end 124 externally threaded and extending through the horizontal arm 126 of the actuator bar 120.

A compression spring 128 is disposed between a nut 130 threaded on the upper end 94 of the actuator shaft 96 and the lower or bottom wall of the chamber 122 in the magazine support block 58 for normally biasing the collet member 80 to its uppermost position, i.e., the positions of each of the collet members 80 shown in the five right-most mechanisms in FIG. 2.

Referring to FIGS. 2 and 4, the lower threaded portion 124 of the actuator shaft 96 is seen to extend through the horizontal arm 126 of the actuator bar 120. A pair of nuts 132, 132 is secured on the bottom portion of the threaded actuator shaft 96 to limit downward movement of the actuator bar 120 relative to the actuator shaft 92; and a second pair of nuts 134, 134 are secured on the lowered portion 124 of the actuator shaft 96 between the lower end of the magazine support block 58 and the actuator bar 120.

A compression spring 136 is disposed between the lower nut 134 and the horizontal arm 126 of the actuator bar 120 for cushioning upward or return movement of the actuator bar 120, in a manner described more fully hereinafter.

Referring now to FIG. 4, a rotatable quill 140, which forms part of the rotatable drill spindle 26 (FIG. 2) is slidably and rotatably mounted within the work stabilizing pressure foot 50.

The quill 140 has a central bore 142 extending part way through the bottom portion thereof. The lower, inner circumferential edge around the bottom of the bore 142 is beveled or champered at 144 to facilitate the quill 140 picking up the upper slotted end 36 of the drill bit holder mechanism 28.

A stop surface 148 is provided at the upper edge of the internal bore 142 in the quill 140 so that the quill 140 descends to pick up the drill bit holder mechanism 28, the surface 148 will engage the upper or outer end 149 of the drill bit holder mechanism 28 to stop further downward movement of the quill 140 relative to the holder mechanism 28.

OPERATION

Normally, the collet support blocks 60 on each of the tool holder magazines 56 are in their raised or "at rest" position. This is the position of the five right-most collet support blocks 60 in FIG. 2. In this position, the compression springs 72, 72 between each of the collet support blocks 60 and the upper surface of the magazine support block 58 maintain each collet support block 60 in its raised position. In this raised position, the collet support blocks 60 loosely support the central portion 82 of the collet member 80. In this position, as shown in FIG. 5, the central portion 82 of the collet member 80 is in its rest position wherein the arcuate sections 86 do not grasp the lower end 32 of the drill bit holder mechanism 28.

When it is desired to have one or more of the drill spindle mechansims 22 pick up a selected tool holder mechanism 28 (i.e., a tool holder mechanism which holds a drill bit 30 of the desired size), the movable work table 14 is moved horizontally to position the tool holder mechanism or mechanisms 28 which are to be picked up beneath the drill spindle mechanism or mechanisms.

Movement of the work table 14 is controlled either by the computer console 24 or by some other suitable programming technique.

After the tool holder mechanism 28 which is to be picked up has been positioned under the drill spindle mechanism 22, the quill 140 (FIG. 4) of the rotatable drill spindle 26 descends over the desired tool holder mechanism 28, as shown in FIG. 4. The beveled lower circumferential edge 144 around the lower edge of the bore 142 in the drill quill 140 facilitates alignment and picking up the tool holder mechanism 28 by the quill 140. The compression springs 72, 72 between the collet block 60 and the magazine block 58 cushion the impact created by the descending drill mechanism, and the resultant downward movement of the collet block 60 prevents the slotted upper end 81 of the collet 80 from holding the tool holder mechanism 28.

As a result of the slotted configuration of the upper end portion 36 of the tool holder mechanism 28 and the very close tolerances between the outer diameter of the upper section 36 and the lower section 32 of the tool holder mechanism 28 and the internal bore 142 in the quill 140, there will be a frictional engagement between the interior peripheral wall of the bore 142 and the exterior periphery of the tool holder mechanism 28.

The drill spindle 26 which carries the drill quill 140 may then be retracted or lifted upwardly. Since the slotted upper end 81 and central portion 82 of the collet are in their normal (unrestrained and unrestrained position, i.e., the position shown in FIG. 5) the collet offers no resistance to the drill quill 140 lifting the tool holder mechanism 28 upwardly.

With the rotatable drill spindle 26 and the drill quill 140 thereof in its lifted position, the movable work table 14 may then be moved to position the drill bit 30 held by the tool holder mechanism 28 over the work to be drilled. Thereafter, the numerically controlled mechanism 10 may be operated in the normal manner to drill holes in the work (not shown) positioned on the work table 14. As the drill spindle 26 and the quill 140 rotate during the drill operation, centrifugal force impels the arcuate portions 40 of the outer end 36 of the drill bit holder mechanism outwardly against the interior peripheral wall of the bore 142 in the quill 140 to firmly hold the tool holder mechanism during the drilling operation.

When it is desired to replace the tool holder mechanism 28 in its appropriate place in the tool holder magazine, the work table 14 is moved until the drill spindle mechanism 22 and its rotatable spindle 26 and quill 140 are positioned over the collet 80 which is to receive the tool holder mechanism 28.

With the drill spindle 26 and the quill 140 thereof positioned over the collet 80 which is to receive and to support the tool holder mechanism 28, the drill quill 140 is lowered as shown in FIG. 4, until the lower end thereof contacts the upper end of the upper portion 81 of the collet member 80.

Thereafter, a suitable switch, not shown, is actuated to introduce air under pressure into the pneumatic line 106 (FIG. 2) to drive the pistons 102, 104, the piston rods 108 and 110 and the actuator bar 120 downwardly to the position shown in FIGS. 2 and 4, against the force of the springs 128 in the chambers 122 in the magazine block 58.

As the actuator bar 120 moves downwardly, it pulls the collet actuator shaft 96 downwardly to pull the central slotted portion 82 of the collet downwardly in the generally truncated cone-shaped bore 88 (see FIG. 4) in the collet support block 60. This action causes the arcuate sections 86 of the upper slotted end 81 of the collet member 80 to be moved or compressed radially inwardly to firmly grasp the lower end 32 of the tool holder mechanism.

Thereafter, the drill spindle 26 and the drill quill 140 thereof may be raised or retracted. As the drill spindle 26 and its drill quill 140 are retracted, the tool holder mechanism 28 which is now firmly engaged by the arcuate sections 86 of the slotted upper end 81 of the collet member will be held in the collet member 80, as shown in FIG. 6. Thus, the drill spindle and its drill quill 140 may be moved to another tool holder mechanism station to pick up a different tool holder mechanism.

After the drill spindle 26 and its drill quill 140 have been raised above the upper end of the tool holder mechanism 28, a suitable switch (not shown) is actuated to stop the feed of air under pressure through the line 106 and the piston chambers 98 and 100. The compression springs 128 will then force the actuator shafts 96 and an actuator bar 120 upwardly to return the actuator bar 120 and the collet members 80 to their original position. The upper ends 81 of the collet 80 will then be in their normal, unrestrained position, shown in FIG. 5, wherein the generally arcuate segments 86 will not firmly engage or hold a tool holder mechanism 28 therein.

Movement of the actuator bar 120 to its original position is cushioned by the springs 136 between the horizontal arm 126 of the actuator bar and the lowermost nuts 134 of the lower ends of the shafts or studs 96.

The embodiment of the present invention shown in the drawings and described above is only one of many possible embodiments of the present invention. It is contemplated that numerous modifications, changes and additions may be made to the embodiment described above without departing from the spirit and scope of the present invention. Accordingly, it is intended that this patent be limited only by the scope of the appended claims.

I claim:
1. An automatic tool changing mechanism for a machining mechanism, comprising:
   a member for releasably retaining a tool mechanism;
   supporting means for supporting a tool mechanism;
   said supporting means being movable between a non-gripping position wherein it is adapted to relatively loosely support a tool mechanism and a gripping position wherein it is adapted to firmly grasp a tool mechanism; and
   means operative in response to delivery of a tool mechanism to said supporting means for moving said supporting means to its said gripping position.

2. An automatic tool changing mechanism according to claim 1, wherein said supporting means comprises a collet for supporting a tool mechanism; said collet including a generally cup-shaped member having a plurality of circumferentially spaced segments adapted to be moved in a radially inward direction to firmly grasp a tool mechanism delivered thereto.

3. An automatic tool changing mechanism according to claim 2, wherein said cup-shaped member has a plurality of radially extending slots therein defining said plurality of circumferentially spaced segments which are adapted to be moved radially inwardly to grasp a tool mechanism delivered thereto.

4. An automatic tool changing mechanism according to claim 3, and further including a collet supporting member adapted to support said collet; and further including actuator means connected to said generally cup-shaped portion of said collet to move said cup-shaped portion relative to said collet support member to cause said circumferentially-spaced segments of said cup-shaped portion of said collet to move radially inwardly to grasp a tool mechanism delevered thereto.

5. An automatic tool changing mechanism according to claim 4, wherein said collet support member includes a bore in which said collet rests; said bore in said collet support member having an internal peripheral wall which is inclined downwardly from a generally larger-diameter portion at one end thereof to a smaller diameter portion at the other end thereof.

6. An automatic tool changing mechanism according to claim 4 wherein said cup-shaped portion of said collet includes a generally truncated cone-shaped outer peripheral wall; and wherein said collet support member includes a bore therein which has an internal peripheral wall which is of a generally truncated cone-shaped configuration.

7. An automatic tool changing mechanism according to claim 4, and further including a stem means connecting said cup-shaped portion of said collet to said actuator mechanism.

8. An automatic tool changing mechanism according to claim 7, wherein said actuator mechanism includes an actuator bar connected to said stem means; and further including a pneumatic piston for selectively pulling said stem means in a direction to cause said cup-shaped portion of said collet to move inwardly in the bore of said collet support member so as to cause said circumferentially-spaced segments of said collet to be moved radially inward.

9. An automatic tool changing mechanism according to claim 8, and further including spring means for biasing said cup-shaped portion of said collet outwardly of said bore in said collet support member so that the circumferentially-spaced segments of said cup-shaped portion of said collet will be in their radially-outward-most position wherein they relatively loosely support a tool mechanism therein.

10. In a numerically controlled drilling machine comprising a base member, a work table on said base member for supporting work to be drilled, and at least one drilling mechanism mounted above said work table and adapted to mount a drill mechanism therein; an improved automatic tool changing mechanism for selectively changing the tool mechanism in said drilling mechanism; said automatic tool changing mechanism comprising;

a plurality of drill mechanism support members mounted on said drilling machine; each of said drill mechanism support members including means for supporting a drill mechanism adapted to be picked up and deposited by said drilling mechanism; each of said drill mechanism support members being movable between a nongripping position wherein said means is adapted to loosely support a drill mechanism and a gripping position wherein said means is adapted to firmly grasp a drill mechanism; and means operative in response to delivery of a drill mechanism to one of said drill mechanism support members for moving said one of said drill mechanism support members from its said nongripping position to its said gripping position.

11. The combination according to claim 10, wherein each of said drill mechanism support members comprises a collet for supporting a drill mechanism; each said collet including a generally cup-shaped member having a plurality of circumferentially spaced segments adapted to be moved in a radially inward direction to firmly grasp a drill mechanism delivered thereto.

12. The combination according to claim 11, wherein said cup-shaped member has a plurality of radially extending slots therein defining said plurality of circumferentially spaced segments which are adapted to be moved radially inwardly to grasp a drill mechanism delivered thereto.

13. The combination according to claim 12, and further including a collet supporting member adapted to support each of said collets; and further including actuator means connected to said generally cup-shaped portions of said collets to move said cup-shaped portions relative to said collet support members to cause said circumferentially-spaced segments of said cup-shaped portions of said collets to move radially inwardly to grasp drill mechanisms therein.

14. The combination according to claim 13, wherein each of said collet support members includes a bore in which said collet rests; said bore in each of said collet support members having an internal peripheral wall which is inclined downwardly from a generally larger-diameter portion at one end thereof to a smaller diameter portion at the other end thereof.

15. The combination according to claim 13 wherein said cup-shaped portion of each of said collets includes a generally truncated cone-shaped outer peripheral wall; and wherein each said collet support member includes a bore therein which has an internal peripheral wall which is of a generally truncated cone-shaped configuration.

16. The combination according to claim 13, and further including a stem means connecting said cup-shaped portion of each of said collets to said actuator mechanism.

17. An automatic tool changing mechanism according to claim 16, wherein said actuator mechanism includes an actuator bar connected to said stem means; and further including a pneumatic piston for selectively pulling said stem means in a direction to cause said cup-shaped portion of each of said collet to move inwardly in the bore of said collet support member so as to cause said circumferentially-spaced segments of said collets to be moved radially inwardly.

18. An automatic tool changing mechanism according to claim 17, and further including spring means for biasing said cup-shaped portions of each of said collets outwardly of said bore in its respective collet support member so that the circumferentially-spaced segments of said cup-shaped portion of each of said collets will be in their radially-outwardmost position wherein they relatively loosely support a drill mechanism therein.

* * * * *